(12) United States Patent
Ritter et al.

(10) Patent No.: US 10,116,279 B2
(45) Date of Patent: Oct. 30, 2018

(54) IMPEDANCE MATCHING FOR INDUCTIVE POWER TRANSFER SYSTEMS

(71) Applicant: Apple Inc., Cupertino, CA (US)

(72) Inventors: David W. Ritter, Cupertino, CA (US);
Jeffrey J. Terlizzi, Cupertino, CA (US);
Todd K. Moyer, Cupertino, CA (US);
Jeffrey M. Alves, Cupertino, CA (US);
Steven G. Herbst, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 471 days.

(21) Appl. No.: 14/628,897

(22) Filed: Feb. 23, 2015

(65) Prior Publication Data

US 2015/0244341 A1 Aug. 27, 2015

Related U.S. Application Data

(60) Provisional application No. 61/943,478, filed on Feb. 23, 2014.

(51) Int. Cl.
| | |
|---|---|
| *H03H 7/38* | (2006.01) |
| *H02J 50/12* | (2016.01) |
| *H02J 50/70* | (2016.01) |
| *H01F 38/14* | (2006.01) |
| *H02J 5/00* | (2016.01) |
| *H02J 7/02* | (2016.01) |
| *H02M 3/335* | (2006.01) |
| *H02M 7/219* | (2006.01) |
| *H02J 17/00* | (2006.01) |

(52) U.S. Cl.
CPC ............... *H03H 7/38* (2013.01); *H01F 38/14* (2013.01); *H02J 5/005* (2013.01); *H02J 7/025* (2013.01); *H02J 17/00* (2013.01); *H02J 50/12* (2016.02); *H02J 50/70* (2016.02); *H02M 3/33523* (2013.01); *H02M 7/219* (2013.01)

(58) Field of Classification Search
CPC .. H02J 5/005; H02J 7/025; H02J 17/00; H02J 50/12
USPC ........................................................ 307/104
See application file for complete search history.

(56) References Cited

U.S. PATENT DOCUMENTS

| | | |
|---|---|---|
| 4,268,899 A | 5/1981 | Rokas |
| 5,293,308 A | 3/1994 | Boys et al. |
| 5,639,989 A | 6/1997 | Higgins, III |
| 6,198,260 B1 | 3/2001 | Wittenbreder |

(Continued)

FOREIGN PATENT DOCUMENTS

| | | |
|---|---|---|
| CN | 1826715 | 8/2006 |
| CN | 101243374 | 8/2006 |

(Continued)

OTHER PUBLICATIONS

U.S. Appl. No. 14/837,965, filed Aug. 27, 2015, Heresztyn et al.

(Continued)

*Primary Examiner* — John Poos
(74) *Attorney, Agent, or Firm* — Brownstein Hyatt Farber Schreck, LLP

(57) ABSTRACT

Methods and apparatuses for improved efficiency of power transfer across an inductive charging interface by adaptively changing the impedance of the receive coil in response to changes in load conditions during inductive power transfer are disclosed.

9 Claims, 6 Drawing Sheets

(56) References Cited

U.S. PATENT DOCUMENTS

| | | |
|---|---|---|
| 6,960,968 B2 | 11/2005 | Odenaal et al. |
| 6,972,543 B1 | 12/2005 | Wells |
| 7,339,558 B2 | 3/2008 | Chen et al. |
| 7,641,358 B1 | 1/2010 | Smith et al. |
| 7,893,564 B2 | 2/2011 | Bennett |
| 7,948,208 B2 | 5/2011 | Partovi et al. |
| 7,952,322 B2 | 5/2011 | Partovi et al. |
| 8,024,491 B1 | 9/2011 | Wright et al. |
| 8,054,651 B2 | 11/2011 | Pollard |
| 8,134,416 B2 | 3/2012 | Moiraghi et al. |
| 8,169,151 B2 | 5/2012 | Kimura |
| 8,169,185 B2 | 5/2012 | Partovi et al. |
| 8,274,178 B2 | 9/2012 | Tucker |
| 8,278,784 B2 | 10/2012 | Cook |
| 8,329,376 B2 | 11/2012 | Kitamura et al. |
| 8,332,547 B2 | 12/2012 | Sugaya |
| 8,362,744 B2 | 1/2013 | Terao et al. |
| 8,421,274 B2 | 4/2013 | Sun et al. |
| 8,446,046 B2 | 5/2013 | Fells et al. |
| 8,629,652 B2 | 1/2014 | Partovi et al. |
| 8,629,654 B2 | 1/2014 | Partovi et al. |
| 8,663,106 B2 | 3/2014 | Stivoric |
| 8,742,625 B2 | 6/2014 | Baarman et al. |
| 8,810,071 B2 | 8/2014 | Sauerlaender et al. |
| 8,853,892 B2 | 10/2014 | Fells et al. |
| 8,884,469 B2 | 11/2014 | Lemmens |
| 8,890,470 B2 | 11/2014 | Partovi et al. |
| 8,896,264 B2 | 11/2014 | Partovi |
| 8,901,881 B2 | 12/2014 | Partovi et al. |
| 8,922,525 B2 | 12/2014 | Chen et al. |
| 8,947,047 B2 | 2/2015 | Partovi et al. |
| 9,018,904 B2 | 4/2015 | Seyerle et al. |
| 9,030,421 B2 | 5/2015 | Tseng et al. |
| 9,057,753 B2 | 6/2015 | Nakano et al. |
| 9,093,857 B2 | 7/2015 | Sakai et al. |
| 9,106,083 B2 | 8/2015 | Partovi |
| 9,112,362 B2 | 8/2015 | Partovi |
| 9,112,363 B2 | 8/2015 | Partovi |
| 9,112,364 B2 | 8/2015 | Partovi |
| 9,124,112 B2 | 9/2015 | Havass et al. |
| 9,126,490 B2 | 9/2015 | Cook |
| 9,148,201 B2 | 9/2015 | Kallal et al. |
| 9,154,189 B2 | 10/2015 | Von Novak et al. |
| 9,160,180 B2 | 10/2015 | Suzuki et al. |
| 9,178,369 B2 | 11/2015 | Partovi |
| 9,197,065 B2 | 11/2015 | Divan et al. |
| 9,197,070 B2 | 11/2015 | Jung |
| 9,231,411 B2 | 1/2016 | Baarman et al. |
| 9,270,138 B2 | 2/2016 | Yamakawa et al. |
| 9,276,437 B2 | 3/2016 | Partovi et al. |
| 9,318,915 B2 | 4/2016 | Miller et al. |
| 9,352,661 B2 | 5/2016 | Keeling et al. |
| 9,356,659 B2 | 5/2016 | Partovi |
| 9,407,107 B2 | 8/2016 | Park et al. |
| 9,460,846 B2 | 10/2016 | Graham et al. |
| 9,461,502 B2 | 10/2016 | Lee |
| 9,496,731 B2 | 11/2016 | Park et al. |
| 9,509,374 B2 | 11/2016 | Kim et al. |
| 9,515,514 B2 | 12/2016 | Lee et al. |
| 9,531,300 B2 | 12/2016 | Harrison et al. |
| 9,537,363 B2 | 1/2017 | Bossetti et al. |
| 9,685,814 B1 | 6/2017 | Moyer et al. |
| 9,716,433 B2 | 7/2017 | Coleman et al. |
| 9,768,643 B2 | 9/2017 | Kanno et al. |
| 9,793,761 B2 | 10/2017 | Sampei et al. |
| 9,800,076 B2 | 10/2017 | Jadidian et al. |
| 9,813,041 B1 | 11/2017 | Ritter |
| 9,831,787 B1 | 11/2017 | Halberstadt |
| 2001/0044588 A1 | 11/2001 | Mault |
| 2008/0284609 A1 | 11/2008 | Rofougaran |
| 2010/0328044 A1 | 12/2010 | Waffenschmidt et al. |
| 2011/0050164 A1 | 3/2011 | Partovi et al. |
| 2011/0109264 A1 | 5/2011 | Choi |
| 2011/0136550 A1 | 6/2011 | Maugars |
| 2011/0198937 A1 | 8/2011 | Tseng |
| 2011/0221385 A1 | 9/2011 | Partovi |
| 2011/0234012 A1 | 9/2011 | Yi et al. |
| 2011/0241615 A1 | 10/2011 | Yeh |
| 2011/0254379 A1 | 10/2011 | Madawala |
| 2011/0302078 A1 | 12/2011 | Failing |
| 2012/0068550 A1 | 3/2012 | De Boer et al. |
| 2012/0169139 A1 | 7/2012 | Kudo |
| 2012/0255039 A1 | 10/2012 | Sipes |
| 2012/0313577 A1 | 12/2012 | Moes et al. |
| 2012/0319646 A1* | 12/2012 | Kamata .................. H02J 7/025 320/108 |
| 2013/0076648 A1 | 3/2013 | Krah et al. |
| 2013/0093388 A1 | 4/2013 | Partovi |
| 2013/0099563 A1 | 9/2013 | Partovi et al. |
| 2013/0257168 A1 | 10/2013 | Singh |
| 2013/0260677 A1 | 10/2013 | Partovi |
| 2013/0271069 A1 | 10/2013 | Partovi |
| 2013/0285604 A1 | 10/2013 | Partovi |
| 2013/0285605 A1 | 10/2013 | Partovi |
| 2013/0300204 A1 | 11/2013 | Partovi |
| 2013/0334326 A1 | 12/2013 | Shan |
| 2014/0015327 A1 | 1/2014 | Keeling et al. |
| 2014/0015522 A1 | 1/2014 | Widmer et al. |
| 2014/0035378 A1 | 2/2014 | Kesler et al. |
| 2014/0103873 A1 | 4/2014 | Partovi et al. |
| 2014/0129010 A1 | 5/2014 | Garg |
| 2014/0132210 A1 | 5/2014 | Partovi |
| 2014/0159656 A1 | 6/2014 | Riehl |
| 2014/0191568 A1 | 7/2014 | Partovi |
| 2014/0191818 A1 | 7/2014 | Waffenschmidt et al. |
| 2014/0197687 A1 | 7/2014 | Lin |
| 2014/0197782 A1 | 7/2014 | Graf et al. |
| 2014/0225439 A1 | 8/2014 | Mao |
| 2014/0266018 A1 | 9/2014 | Carobolante |
| 2014/0306654 A1 | 10/2014 | Partovi |
| 2014/0347007 A1 | 11/2014 | Kee et al. |
| 2015/0001950 A1 | 1/2015 | Chung et al. |
| 2015/0035372 A1 | 2/2015 | Aioanei |
| 2015/0077045 A1 | 3/2015 | Harris |
| 2015/0280455 A1 | 3/2015 | Bosshard et al. |
| 2015/0130412 A1 | 5/2015 | Partovi |
| 2015/0207333 A1 | 7/2015 | Baarman et al. |
| 2015/0215006 A1 | 7/2015 | Mehas et al. |
| 2015/0244179 A1 | 8/2015 | Ritter et al. |
| 2015/0244341 A1 | 8/2015 | Ritter et al. |
| 2015/0270058 A1 | 9/2015 | Golko et al. |
| 2015/0333530 A1 | 11/2015 | Moyer et al. |
| 2015/0349538 A1 | 12/2015 | Agostinelli et al. |
| 2015/0364931 A1 | 12/2015 | Ren et al. |
| 2016/0043567 A1 | 2/2016 | Matumoto et al. |
| 2016/0056664 A1 | 2/2016 | Partovi |
| 2016/0064948 A1 | 3/2016 | Heresztyn et al. |
| 2016/0064992 A1 | 3/2016 | Herbst et al. |
| 2016/0127672 A1 | 5/2016 | Kamide et al. |
| 2016/0172894 A1 | 6/2016 | Khripkov et al. |
| 2016/0181849 A1 | 6/2016 | Govindaraj |
| 2016/0261137 A1 | 9/2016 | Riehl |
| 2016/0285278 A1 | 9/2016 | Mehas et al. |
| 2017/0012463 A1 | 1/2017 | Lynch |
| 2017/0089959 A1 | 3/2017 | Ito et al. |
| 2017/0110911 A1 | 4/2017 | Bossetti et al. |
| 2017/0222493 A1 | 8/2017 | Oki et al. |

FOREIGN PATENT DOCUMENTS

| | | |
|---|---|---|
| CN | 101232190 | 7/2008 |
| CN | 101777801 | 7/2010 |
| CN | 101814757 | 8/2010 |
| CN | 102124624 | 7/2011 |
| CN | 102257696 | 11/2011 |
| CN | 102355035 | 2/2012 |
| CN | 202712982 | 1/2013 |
| CN | 102998711 | 3/2013 |
| CN | 103019485 | 4/2013 |
| CN | 202976038 | 6/2013 |
| CN | 103248132 | 8/2013 |
| CN | 103269092 | 8/2013 |
| CN | 103324333 | 9/2013 |
| CN | 103326475 | 9/2013 |

(56) References Cited

FOREIGN PATENT DOCUMENTS

| | | |
|---|---|---|
| CN | 103457362 | 12/2013 |
| CN | 103518175 | 1/2014 |
| CN | 103545893 | 1/2014 |
| CN | 103597711 | 2/2014 |
| CN | 103765722 | 4/2014 |
| CN | 103812162 | 5/2014 |
| CN | 103999320 | 8/2014 |
| CN | 104037750 | 9/2014 |
| EP | 1633122 | 8/2005 |
| EP | 2642628 | 9/2013 |
| GB | 2484999 | 5/2012 |
| JP | H06311658 | 4/1994 |
| JP | H06268565 | 9/1994 |
| JP | H08149608 | 6/1996 |
| JP | H08331850 | 12/1996 |
| JP | H10173741 | 6/1998 |
| JP | 2001069388 | 3/2001 |
| JP | 2001333551 | 11/2001 |
| JP | 2010161882 | 7/2010 |
| JP | 2010268531 | 11/2010 |
| JP | 2011120443 | 6/2011 |
| JP | 2011259612 | 12/2011 |
| JP | 2012503959 | 2/2012 |
| JP | 2013115929 | 6/2013 |
| JP | 2013183497 | 9/2013 |
| JP | 2013536664 | 9/2013 |
| JP | 2014023281 | 3/2014 |
| JP | 2014193087 | 10/2014 |
| KR | 20130055199 | 5/2013 |
| KR | 20140061337 | 5/2014 |
| WO | WO 09/045847 | 4/2009 |
| WO | WO 10/077991 | 7/2010 |
| WO | WO 10/108191 | 9/2010 |
| WO | WO 11/156555 | 12/2011 |
| WO | WO 12/085119 | 6/2012 |
| WO | WO 13/011905 | 1/2013 |
| WO | WO 13/122625 | 8/2013 |
| WO | WO 14/034966 | 3/2014 |
| WO | WO 16/024869 | 2/2016 |

OTHER PUBLICATIONS

U.S. Appl. No. 14/627,957, filed Feb. 20, 2015, Ritter et al.
U.S. Appl. No. 14/795,723, filed Jul. 9, 2015, Herbst et al.
U.S. Appl. No. 15/393,435, filed Dec. 29, 2016, Bossetti et al.
U.S. Appl. No. 15/467,998, filed Mar. 23, 2017, Bentov et al.
U.S. Appl. No. 15/468,001, filed Mar. 23, 2017, Qiu et al.
U.S. Appl. No. 15/626,930, filed Jun. 19, 2017, Moyer et al.
U.S. Appl. No. 15/829,610, filed Dec. 1, 2017, Qiu et al.
U.S. Appl. No. 15/829,850, filed Dec. 1, 2017, Qiu et al.
International Search Report and Written Opinion dated May 6, 2015, PCT/US2015/016951, 12 pages.
U.S. Appl. No. 15/179,922, filed Jun. 10, 2016, Lynch.

* cited by examiner

IMPEDANCE MATCHING FOR INDUCTIVE POWER TRANSFER SYSTEMS

CROSS-REFERENCE TO RELATED APPLICATIONS

This application is a nonprovisional patent application of and claims the benefit to U.S. Provisional Patent Application No. 61/943,478 filed Feb. 23, 2014 and titled "Impedance Matching for Inductive Power Transfer Systems," the disclosure of which is hereby incorporated herein in its entirety.

TECHNICAL FIELD

This disclosure relates to efficiency management for electromagnetic induction power transfer systems, and in particular to systems and methods for augmenting the impedance of an inductive power receiving accessory or inductive power receiving electronic device.

BACKGROUND

Many portable electronic devices include one or more rechargeable batteries that require external power to recharge from time to time. Such devices may include cell phones, smart phones, tablet computers, laptop computers, wearable devices, navigation devices, sports devices, health devices, medical devices, accessory devices, peripheral input devices, and so on.

Some electronic devices may include an inductive charging system in lieu of a cable or tethered charging system. In these examples, a user may place the portable electronic device on an inductive charging surface ("dock") to replenish a rechargeable battery via electromagnetic induction. In these systems, an electromagnetic coil ("transmit coil") within the dock may inductively couple to an electromagnetic coil ("receive coil") within the portable electronic device. By alternating or switching the current through the transmit coil, current may be induced in the receive coil. The portable electronic device may be adapted to use the received current to replenish the charge of a rechargeable battery.

Many portable electronic devices may enter multiple power modes during an inductive power transfer. For example, a portable electronic device with a rechargeable battery may switch, after a period of time, from a trickle charging mode drawing low power to a constant current charging mode drawing relatively high power. Each of the several operational modes may present a different load condition as seen by the inductive power transmitter. In many cases, changing load conditions decreases efficiency of power transfer between the transmitter and receiver.

Accordingly, there may be a present need for a system and method for efficiently and rapidly delivering useful power to a portable electronic device across multiple power modes.

SUMMARY

Embodiments described herein may relate to, include, or take the form of methods, systems, and apparatuses for managing efficiency across an inductive charging interface. Such embodiments can include an inductive power transmitter and an inductive power receiver. An impedance controller may be coupled to the power receiving inductor and may be configured to increase or decrease an electrical impedance of the inductive power receiver in response to a change in a power requirement of a portable electronic device coupled to the inductive power receiver.

Many embodiments may include a configuration in which the impedance controller is configured to maintain the effective impedance of the portable electronic device from the perspective of the inductive power transmitter at substantially the same value through all or substantially all load conditions of the portable electronic device.

Further embodiments may include a configuration in which the impedance controller may be a boost converter. In certain further embodiments, the impedance controller may be a buck converter. Still further embodiments include one of a buck or boost converter integrated within a bridge rectifier.

Further embodiments described herein may relate to, include, or take the form of a method of dynamically adjusting the impedance of an inductive power receiving apparatus. For example, in certain embodiments, the method may include steps of determining the load condition of the inductive power receiver and adjusting the receiver impedance.

BRIEF DESCRIPTION OF THE FIGURES

Reference will now be made to representative embodiments illustrated in the accompanying figures. It should be understood that the following descriptions are not intended to limit the disclosure to one preferred embodiment. To the contrary, it is intended to cover alternatives, modifications, and equivalents as may be included within the spirit and scope of the described embodiments as defined by the appended claims.

The use of the same or similar reference numerals in different drawings indicates similar, related, or identical items.

DETAILED DESCRIPTION

Figure 1:
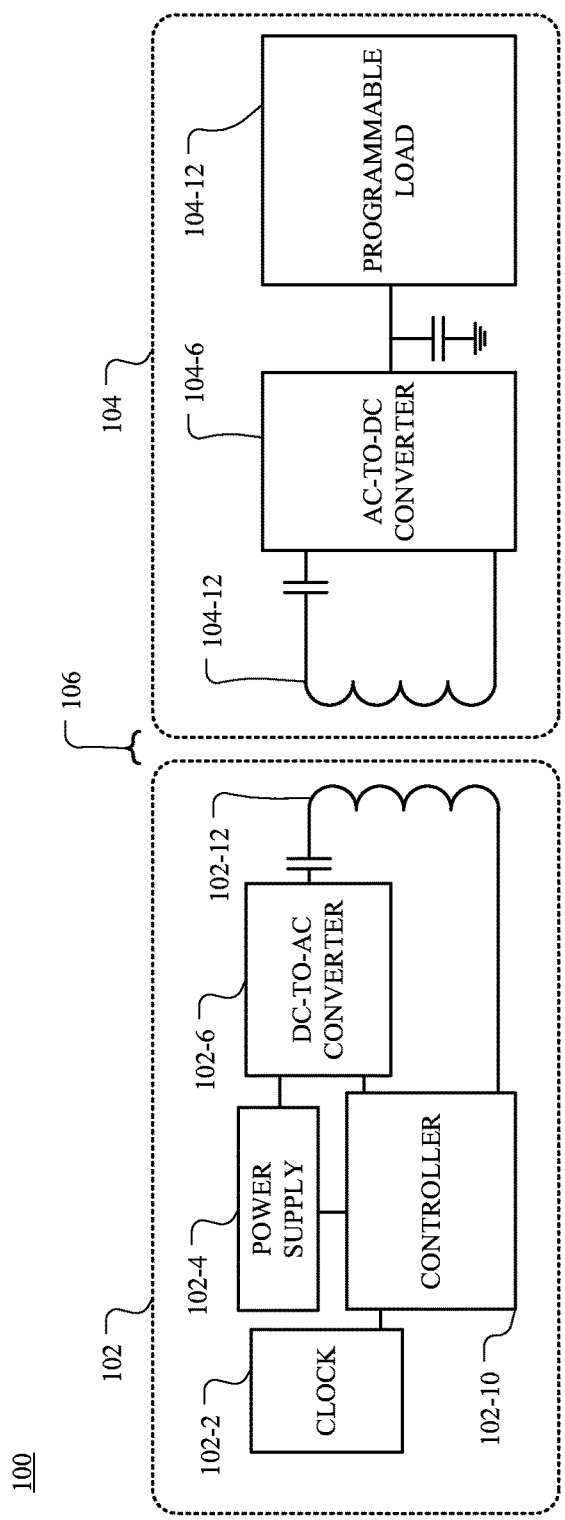
FIG. 1 is a simplified signal flow block diagram of a sample inductive power transfer system.

Embodiments described herein may relate to or take the form of methods and apparatuses for managing the efficiency of inductive charging interface. It should be appreciated that the various embodiments described herein, as well as functionality, operation, components, and capabilities thereof may be combined with other elements as necessary, and so any physical, functional, or operational discussion of any element or feature is not intended to be limited solely to a particular embodiment to the exclusion of others.

Embodiments described herein relate to an inductive charging system that may include an inductive power transmitting apparatus to transmit power and a portable electronic device or accessory to receive power. Such electronic devices may include media players, media storage devices, personal digital assistants, tablet computers, cellular telephones, laptop computers, smart phones, styluses, global positioning sensor units, remote control devices, wearable devices, electric vehicles, home appliances, medical devices, health devices, sports devices and so on.

In many examples, when a portable electronic device is placed proximate a power-transmitting inductor (e.g., "transmit coil") of an inductive power transmitting apparatus (e.g., "dock" or "charging station"), the portable electronic device may activate inductive charging circuitry including a power-receiving inductor (e.g., "receive coil") in order to communicate to the inductive power transmitting apparatus that the portable electronic device is ready to receive power. In other examples, the power-receiving inductor and/or the portable electronic device may simply receive power, without prior communication, from the charging station. By applying an alternating or other switched current to the transmit coil, current may be induced in the receive coil. The portable electronic device may use the received current to replenish the charge of the one or more rechargeable batteries.

Power management embodiments may take the form of adaptive power management systems within both a transmitter and receiver of inductive energy. For example, when a portable electronic device is placed proximate an inductive charging station, the inductive charging station may activate inductive power transfer circuitry. At all other times, the interactive power transfer circuitry may be completely powered off. In other examples, the transmit coil may constantly transmit power. In such an example, when the portable electronic device is placed proximate the transmit coil, the portable electronic device may receive inductive power. In still further examples, the transmit coil may intermittently transmit power.

In other embodiments, a power transmitting coil may inductively couple with a power receiving coil. Upon coupling, the transmit coil may experience an increased load. Accordingly, when the power requirements of a portable electronic device change, the load experienced by the transmit coil may also change. For example, the portable electronic device may include multiple power-receiving load conditions. As another example, when a portable device is fully charged the load corresponding to that device can drop.

In one embodiment, the portable electronic device may at least intermittently or occasionally operate in a trickle charging mode. In these embodiments, the portable electronic device may direct power received from the inductive power receiver to an internal battery at a relatively low current. Trickle charging may, in one example, be used to top off a fully charged battery at a rate substantially equal to the self-discharge rate of the internal battery. In another example, trickle charging may be used to replenish a substantially depleted battery. For many battery types, trickle charging on substantial depletion may lengthen the life of the battery. During trickle charging, the portable electronic device may draw relatively low power from the inductive power receiver.

In addition, the portable electronic device may include a constant current charging mode. In such embodiments, the portable electronic device may direct power received from the inductive power receiver to the internal battery at a constant current. In many examples, the current drawn may be higher than the current used for trickle charging the same battery. In these examples, the portable electronic device may draw relatively high power form the inductive power receiver.

As still another option, the portable electronic device may include a direct power mode in which the components of the portable electronic device may be operated entirely or substantially by power received from the inductive power receiver. In these embodiments, the portable electronic device may include one or more components that may use varying amounts of power. For example, some portable electronic devices may include a display with a backlight whose power consumption may be a function of the brightness desired. In another example, some portable electronic devices may include one or more processors whose power consumption may vary between processing tasks. As still another example, an electronic device may consume more power in an operative mode than a standby mode.

For each distinct power mode, the power consumption and thus the resistive load presented by the portable electronic device may vary which may, in some cases, reduce the efficiency of the power transfer. In many cases, the variance of the resistive load can be subdivided, generally, into an operating resistive load portion and an instantaneous resistive load portion. Together, the operating resistive load portion and the instantaneous resistive load portion combine to make up the resistive load presented by the portable electronic device.

In many examples, the operating resistive load portion may be larger than the instantaneous resistive load portion. The operating resistive load portion can be defined at least in part by the power mode of the portable electronic device. For example, a portable electronic device can have a different operating resistive load when the portable electronic device is in a trickle charging mode than when the portable electronic device is in a direct power mode. In these examples, the portable electronic device can communicate information regarding the operating resistive load to an inductive power transmitter, since, in many cases, the portable electronic device switches between power modes relatively infrequently.

The instantaneous resistive load portion may be defined, at least in part, by asynchronous or otherwise unpredictable functionality changes of the portable electronic device. For example, the instantaneously resistive load can increase when a display coupled to the portable electronic device is enabled and on, for example when a user is interacting with the device. In other examples, the instantaneously resistive load can increase when one or more sensors of the device are operating. In other examples, the instantaneously resistive load can increase when a timer of the device elapses causing the device to emit a sound, provide a haptic response, illuminate a notification light, or illuminate the screen. In other examples, the instantaneously resistive load can decrease when the device enters a lower power mode after determining that the device is idle. Unlike the operating resistive load, however, in many embodiments, it may be difficult for the portable electronic device to communicate to the inductive power transmitter changes in instantaneous resistive load. Accordingly, for many embodiments described herein, the portable electronic device may internally, without communicating to the inductive power transmitter, account for instantaneous resistive load.

Although many examples of instantaneous and operational load changes are listed above, one may appreciate that these examples are neither limiting nor exhaustive.

In many embodiments, an inductive power transmitter may adjust one or more characteristics of power transmission (e.g., selectable and/or controllable duty cycle, voltage, current, frequency, and so on) to improve efficiency of the transfer given the instant power requirements of the inductive power receiver and portable electronic device. In many examples, the reaction of the inductive power transmitter to changes in the power requirements of the inductive power receiver may be somewhat delayed. For example, the inductive power transmitter may require a communication from the inductive power receiver before increasing or decreasing the power transmitted. These delays may, in many examples, cause an inefficient amount of power to be transferred during the period that the inductive power transmitter is confirming or otherwise discovering the power requirements of the inductive power receiver. For example, the inductive power transmitter may transmit too much or too little power for a period of time before the appropriate characteristics of power transmission may be adjusted.

Accordingly, many embodiments discussed herein include an impedance controller within the inductive power receiving apparatus. The impedance controller may dynamically adjust the impedance of the inductive power receiver in direct response to changes in the power requirements of the portable electronic device. In this manner, the inductive power transmitter may see a continuous and consistent load, independent of instant changes within the inductive power receiver or portable electronic device.

FIG. 1 is a simplified signal flow block diagram of a sample inductive power transfer system. The inductive power transfer system 100 may include an inductive power transmitter 102 and an inductive power receiver 104. The inductive power transmitter 102 and the inductive power receiver 104 may be separated by a gap 106. In many embodiments, the gap 106 may be an air gap and/or may include one or more housings, such as a housing for the transmitter and/or the receiver (examples of which include dock housings and device housings).

The inductive power receiver 104 can be any suitable electronic device, such as a wearable communication device, a wearable health assistant, a smart telephone, or a media player. For example, the wearable health assistant can provide health-related information (whether real-time or not) to the user, authorized third parties, and/or an associated monitoring device. The device may be configured to provide health-related information or data such as but not limited to heart rate data, blood pressure data, temperature data, oxygen level data, diet/nutrition information, medical reminders, health-related tips or information, or other health-related data. The associated monitoring device may be, for example, a tablet computing device, phone, personal digital assistant, computer, and so on.

As another example, the wearable communications device may include a processor coupled with or in communication with a memory, one or more communication interfaces, output devices such as displays and speakers, and one or more input devices. The communication interface(s) can provide electronic communications between the communications device and any external communication network, device or platform, such as but not limited to wireless interfaces, Bluetooth interfaces, USB interfaces, Wi-Fi interfaces, TCP/IP interfaces, network communications interfaces, or any conventional communication interfaces. The wearable communications device may provide information regarding time, health, statuses or externally connected or communicating devices and/or software executing on such devices, messages, video, operating commands, and so forth (and may receive any of the foregoing from an external device), in addition to communications.

The inductive charging system 100 may include an oscillator such as clock circuit 102-2 operatively connected to a controller 102-10 and a direct current converter 102-6. The clock circuit 102-2 can generate one or more timing signals for the inductive charging system 100.

The controller 102-10 may be coupled to a power supply 102-4. The power supply 102-4 may be a direct current power supply, although this is not necessary. In certain embodiments, the controller 102-10 may control the state of the direct current converter 102-6, which may take power input from the power supply 102-4. In one embodiment, the clock circuit 102-2 generates periodic signals that are used by the controller 102-10 to activate and deactivate switches in the direct current converter 102-6 on a per cycle basis. The switches may convert the direct current from the power supply 102-4 to alternating current suitable for exciting a transmit coil 102-12.

Any suitable direct current converter 102-6 can be used in the inductive charging system 100. For example, in one embodiment, an H bridge may be used as a direct current converter.

In some embodiments, an H bridge may not be required. For example, a single switch may control the flow of current from the direct current converter 102-6. In this manner, the direct current converter 102-6 may function as a square wave generator.

The time-varying signal or square wave signal produced by the direct current converter 102-6 may be input into a transformer. Typically, a transformer such as those used in the above-referenced tethered power transfer systems includes a transmit coil coupled to a receive coil, with each coil wrapped about a common core. However, an inductive charging system 100 as described herein typically includes a primary coil 102-12 and a receive coil 104-12 separated by a gap 106 and, in some embodiments, the respective housings containing each coil. As illustrated, the transformer may not necessarily be a physical element but instead may refer to the relationship and interface between two inductively proximate electromagnetic coils such as a transmit coil 102-12 and a receive coil 104-12.

The foregoing is a simplified description of the transmitter and its interaction with a receive coil 104-12 of an inductive power transfer system. The transmitter may be configured to provide a time-varying voltage to the transmit coil 102-12 in order to induce a voltage within the receive coil 104-12. Although both alternating currents and square waves are used as specific examples, one may appreciate that other waveforms are contemplated. In such a case, the controller 102-10 may control a plurality of states of the direct current converter 102-6. For example, the controller 102-10 may control the voltage, current, duty cycle, waveform, frequency, or any combination thereof.

The controller 102-10 may periodically modify various characteristics of the waveforms applied to the transmit coil 102-12 in order to increase the efficiency of the operation of the power transmitting circuitry. The various modifications may be made in real time, in a predetermined sequence, or may be fixed from time to time. One may appreciate that specific modifications may be desirable for specific circumstances.

For example, in certain cases, the controller 102-10 may discontinue all power to the transmit coil 102-12 if it is determined that the receive coil 104-12 is not be inductively proximate the transmit coil 102-12. This determination may be accomplished in any number of suitable ways. For example, the controller 102-10 may be configured to detect the inductive load on the transmit coil 102-12. If the inductive load falls below a certain selected threshold, the controller 102-10 may conclude that the receive coil 104-12 may not be inductively proximate the transmit coil 102-12 (e.g., close enough to the transmit coil to receive power, or receive power above a threshold). In such a case, the controller 102-10 may discontinue all power to the transmit coil 102-12.

In other cases, in one embodiment the controller 102-10 may set the duty cycle to be at or near a resonance frequency of the transformer. In another example, the period of the waveform defining the active state of the duty cycle (e.g., high) may be selected to be at or near the resonance frequency of the transformer. One may appreciate that such selections may increase the power transfer efficiency between the transmit coil 102-12 and the receive coil 104-12 and, accordingly, decrease thermal losses within the system.

In an alternate example, the controller 102-10 may discontinue all power to the transmit coil 102-12 if a sudden spike in inductive load is sensed. For example, if the inductive load spikes at a particular rate above a certain selected threshold the controller 102-10 may conclude that an intermediate object may be placed inductively proximate the transmit coil 102-12. In such a case, the controller 102-10 may discontinue all power to the transmit coil 102-12. Alternately, such a spike in inductive load may be used as a signal to active inductive charging and thus to power the transmit coil 102-12.

In still further examples, the controller 102-10 may modify other characteristics of the waveforms applied to the transmit coil 102-12. For example, if the receiver circuitry requires additional power, the controller 102-10 may increase the duty cycle of the waveform applied to the transmit coil 102-12. In a related example, if the receiver circuitry requires less power, the controller 102-10 may decrease the duty cycle of the waveform applied to the transmit coil 102-12. In each of these examples, the time average power applied to the transmit coil 102-12 may be modified.

In another example, the controller 102-10 may be configured to modify the amplitude of the waveform applied to the transmit coil 102-12. In such an example, if the receiver circuitry requires additional power, the controller 102-10 may amplify the maximum voltage of the waveform applied to the transmit coil 102-12. In the related case, the maximum voltage of the waveform may be reduced if the receiver circuitry requires less power.

The transmitter 102 portion of the inductive power transfer system 100 may be configured to provide a time-varying signal to the transmit coil 102-12 in order to induce a voltage within the receive coil 104-12 in the receiver through inductive coupling between the transmit coil 102-12 and the receive coil 104-12. In this manner, power may be transferred from the transmit coil 102-12 to the receive coil 104-12 through the creation of a varying magnetic flux by the time-varying signal in the transmit coil 102-12.

The time-varying signal produced in the receive coil 104-12 may be received by a direct current converter 104-6 that converts the time-varying signal into a direct current signal. Any suitable direct current converter 104-6 can be used in the inductive charging system 100. For example, in one embodiment, a rectifier may be used as a direct current converter. The direct current signal may then be received by a programmable load 104-12.

In some embodiments, the receiver direct current converter 104-6 may be a half bridge. In such examples, the receive coil 104-12 may have an increased number of windings. For example, in some embodiments, the receive coil may have twice as many windings. In this manner, as one may appreciate, the induced voltage across the receive coil 104-12 may be reduced by half, effectively, by the half bridge rectifier. In certain cases, this configuration may require substantially fewer electronic components. For example, a half bridge rectifier may require half as many transistors as a full wave bridge rectifier. As a result of fewer electronic components, resistive losses may be substantially reduced.

In certain some embodiments, the receiver may also include circuitry to tune out or reduce magnetizing inductance present within the transmitter. Generally, magnetizing inductance may result in losses within a transformer formed by imperfectly coupled coils. This magnetizing inductance, among other leakage inductance, may substantially reduce the efficiency of the transmitter. One may further appreciate that, because magnetizing inductance may be a function of the coupling between a transmit and receive coil, it may not necessarily be entirely compensated for within the transmitter itself. Accordingly, in certain embodiments discussed herein, tuning circuitry may be included within the receiver. For example, in certain embodiments, a capacitor may be positioned parallel to the programmable load 104-12.

In still further examples, a combination of the above-referenced sample modifications may be made by the controller. For example, the controller 102-10 may double the voltage in addition to reducing the duty cycle. In another example, the controller may increase the voltage over time, while decreasing the duty cycle over time. One may appreciate that any number of suitable combinations are contemplated herein.

Figure 2:
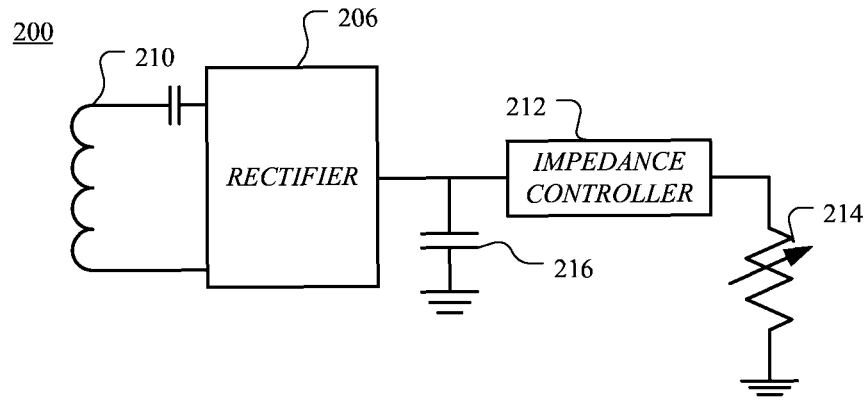
FIG. 2 is a simplified signal flow diagram of one example of an inductive power receiver adapted to dynamically adjust receiver impedance.

FIG. 2 is a simplified signal flow diagram of one example of an inductive power receiver adapted to dynamically adjust receiver impedance. The inductive power receiver 200 may include a receive coil 210 that is coupled to a rectifier 206 which in turn may couple to an impedance controller 212 that may output a direct current voltage to a variable resistive load 214. In many examples, the receive coil 210 may be connected to a resonant capacitor to facilitate resonance of the inductive power receiver 200 with the associated inductive power transmitter. One may appreciate that upon resonance, power transfer efficiency from the inductive power transmitter to the inductive power receiver may be increased.

The receive coil 210 may be coupled to a rectifier 206. In certain embodiments, the rectifier may be a full wave rectifier, half wave rectifier, a passive rectifier or an active rectifier. The rectifier 206 may be configured to convert an alternating current received from the receive coil 210 to direct current useful to a portable electronic device. In many embodiments, a filter capacitor 216 may be coupled to the output of the rectifier 206 to filter certain noise from the output of the rectifier 206. In this manner, the filter capacitor 216 may smooth the direct current output from the rectifier 206.

The rectifier 206 may be coupled to an impedance controller 212. The impedance controller may be configured and adapted to provide for a constant or substantially constant impedance as seen by the associated transmit coil through the rectifier 206 and the receive coil 210 in response to a change in the load conditions exhibited by the variable resistive load 214. For example, in certain embodiments, the variable resistive load 214 may be a portable electronic device. As described above, the portable electronic device may exhibit different load conditions for different functions of the portable electronic device.

For example, if the portable electronic device includes a display, the portable electronic device may require more power (thus having a lower effective resistance) when the display is enabled and on, for example when a user is interacting with the device. In other examples, the portable electronic device may require more power (thus having a lower effective resistance) when one or more sensors of the device are operating. In other examples, the portable electronic device may require more power when a timer of the device elapses causing the device to emit a sound, provide a haptic response, illuminate a notification light, or illuminate the screen. In other examples, the portable electronic device may require less power (thus having a higher effective resistance) when the device enters a lower power mode after determining that the device is idle.

In these examples, the rapid transition between different load conditions can cause the portable electronic device to exhibit rapidly changing impedance, which, as described above, can substantially impact the efficiency of power transfer from a power transmitter to an inductive power receiver.

In response to differing power requirements of the variable resistive load 214, the impedance controller 212 may adjust itself to compensate. For example if the variable resistive load 214 requires additional power at an established output voltage, the current may increase and the load impedance may decrease. The impedance controller 212 may react by increasing the load impedance to maintain efficiency. Similarly, if the variable resistive load 214 requires less power, the effective load impedance will increase. The impedance controller 212 may react by lowering the load impedance to maintain efficiency.

Figure 3:
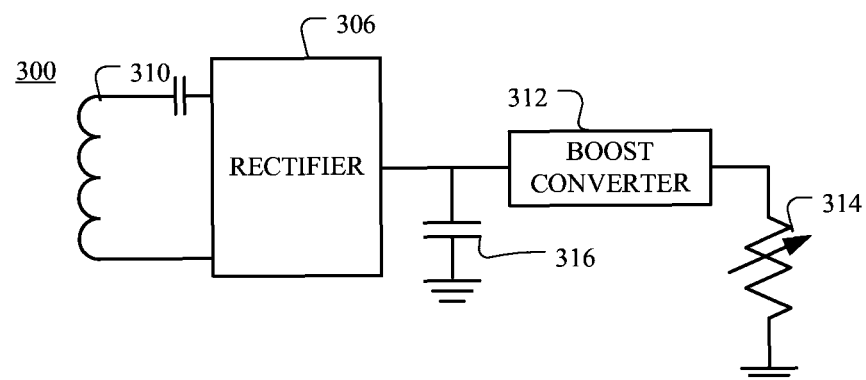
FIG. 3 is a simplified signal flow diagram of one example of an inductive power receiver adapted to dynamically decrease receiver impedance.

FIG. 3 is a simplified signal flow diagram of one example of an inductive power receiver adapted to dynamically decrease receiver impedance. The inductive power receiver 300 may include a receive coil 310 that is coupled to a rectifier 306 which in turn may couple to a boost converter 312 that may output a direct current voltage to a variable resistive load 314.

The boost converter 312 may operate to boost the voltage to the variable resistive load 314. In many embodiments, the conversion factor of the boost converter 312 may dynamically change. For example, in certain embodiments, the conversion factor of the boost converter 312 may be continually adjusted as the load presented by the variable resistive load 314 changes. In this manner, the equivalent resistance of the circuit as seen by the rectifier remains constant.

The boost converter 312 may be adjusted when the variable resistive load 314 exhibits especially high resistance, consuming relatively low current. By dynamically adjusting the conversion factor of the boost converter 312, the effective resistance (e.g., impedance) of the variable resistive load 314 may be reduced.

In other examples, the voltage output from the boost converter 312 can be reduced by dynamically adjusting the conversion factor of the boost converter 312. For example, in a first mode, the conversion factor of the boost converter 312 can be set to a first value greater than 1.0. Thereafter, if the voltage output from the boost converter 312 should be decreased, the conversion factor of the boost converter 312 can be reduced toward 1.0.

In many embodiments, a filter capacitor 316 may be coupled to the output of the rectifier 306 to filter certain noise from the output of the rectifier 306. In this manner, the filter capacitor 316 may smooth the direct current output from the rectifier 306.

One may appreciate that for direct current circuits, or direct current portions of circuits, that the terms "impedance" and "resistance" are substantially interchangeable. This is because absent alternating current, the reactance of the circuit may be substantially negligible.

Figure 4:
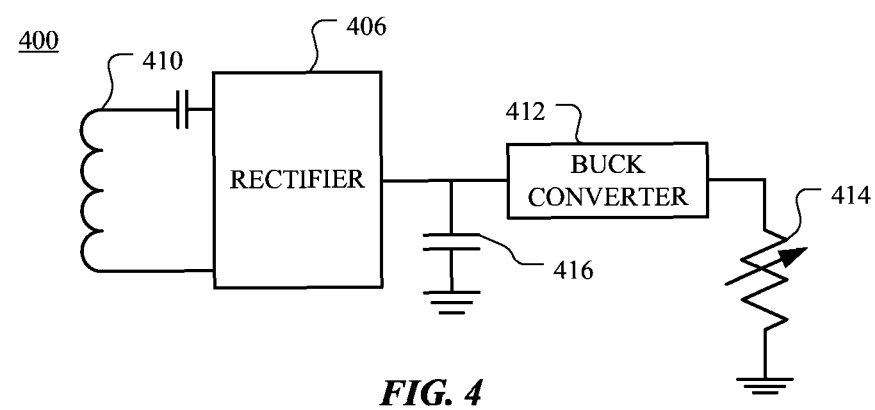
FIG. 4 is a simplified signal flow diagram of one example of an inductive power receiver adapted to dynamically increase receiver impedance.

FIG. 4 is a simplified signal flow diagram of one example of an inductive power receiver adapted to dynamically increase receiver impedance. The inductive power receiver 400 may include a receive coil 410 that is coupled to a rectifier 406 which in turn may couple to a buck converter 412 that may output a direct current voltage to a variable resistive load 414.

The buck converter 412 may operate to reduce the voltage to the variable resistive load 414. In many embodiments, the conversion factor of the buck converter 412 may dynamically change. For example, as with the boost converter as depicted in FIG. 3, the conversion factor of the buck converter 412 may be continually adjusted as the load presented by the variable resistive load 414 changes. In this manner, the equivalent resistance of the circuit as seen by the rectifier 406 remains constant. By dynamically adjusting the conversion factor of the buck converter 412, the effective resistance (e.g., impedance) of the variable resistive load 414 may be increased.

In other examples, the voltage output from the buck converter 412 can be increased by dynamically adjusting the conversion factor of the buck converter 412. For example, in a first mode, the conversion factor of the boost converter 412 can be set to a first value less than 1.0. Thereafter, if the voltage output from the boost converter 412 should be decreased, the conversion factor of the boost converter 412 can be increased toward 1.0.

In many embodiments, a filter capacitor 416 may be coupled to the output of the rectifier 406 to filter certain noise from the output of the rectifier 406. In this manner, the filter capacitor 416 may smooth the direct current output from the rectifier 406.

Figure 5:
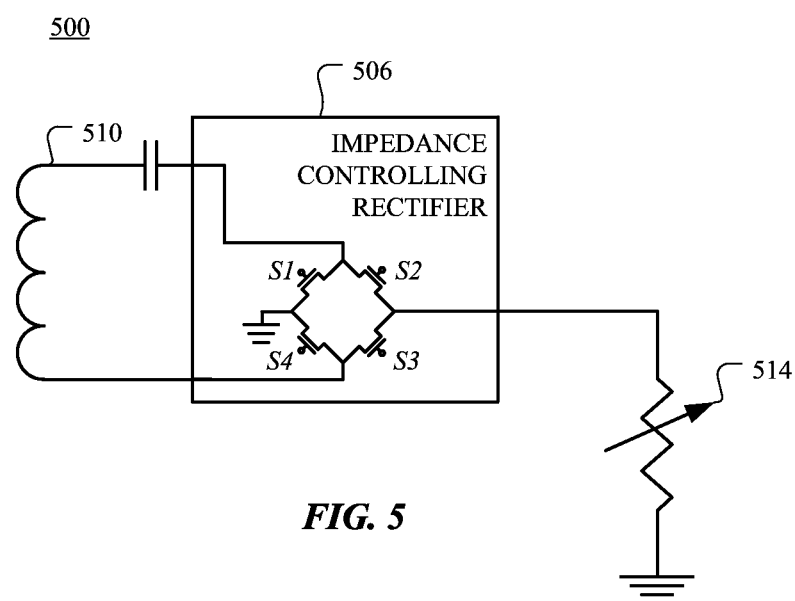
FIG. 5 is a simplified signal flow diagram of one example of an inductive power receiver adapted to dynamically decrease receiver impedance.

FIG. 5 is a simplified signal flow diagram of one example of an inductive power receiver adapted to dynamically decrease receiver impedance. For example, the inductive power receiver 500 may include an impedance controlling rectifier 506 that is coupled to a variable resistive load 514. The impedance controlling rectifier 506 may be a boost converter in certain embodiments, suitable to boost the voltage to the variable resistive load 514 to present the same effective impedance to the receive coil 510.

In certain further embodiments, the impedance controlling rectifier 506 may be a boost converter integrated within an active rectifier circuit. For example, the switches of the active rectifier may be used as the switch element of the boost converter. In many embodiments, the combination of the boost converter within the active rectifier may be adapted to improve efficiency in a number of ways. For example, the use of switches for an active rectifier in lieu of diodes for a passive rectifier reduces efficiency losses resulting from the turn-on voltage required of each diode. In another example, the combination of the boost converter and the active rectifier may reduce complexity and the number of components required within the inductive power receiver 500.

A boost converter combined with an active rectifier may take a number of suitable forms. For example, in one embodiment an active rectifier may include four switches S1-S4. In on typical example, S1 and S3 may be on whenever the first terminal of the receive coil 510 is positive (e.g., one half of a full wave or cycle) while S2 and S4 may be on whenever the second terminal of the receive coil 510 is positive (e.g., the other half of the full wave or cycle). In this manner, alternating or switched current may be converted to direct current useful for the variable resistive load 514.

However, in certain embodiments, the switch elements associated with the active rectifier may be switched more frequently than once per half cycle. For example, S1 may be periodically closed for a particular portion of a cycle during which the first terminal of the receive coil 510 is positive. When the switch S1 is closed during the same cycle, the current in leakage inductance may increase in response. When the switch S1 is opened again during the same cycle, a tuning capacitor may begin to collect charge. In this manner, with a 50% duty cycle of the active rectifier switches, the voltage may be doubled at the output of the impedance controlling rectifier 506. At the same time, the load current may be doubled at the input of the impedance controlling rectifier 506. In this manner, the effective input resistance of the impedance controlling rectifier 506 and the variable resistive load 514 is maintained constant.

In other words, that the leakage inductance of the receive coil 510 is used as the inductor required of the boost converter. Similarly, the switches of the active rectifier may be used as the switching element of the boost converter. Thus, by dynamically adjusting the conversion factor of the boost converter associated with impedance controlling rectifier 506, the effective resistance (e.g., impedance) of the variable resistive load may compensate for changes in the power requirements of the variable resistive load 514.

In still further embodiments, the switches associated with the impedance controlling rectifier 506 may effectively ground both terminals of the receive coil 510 for a portion of each cycle. In this manner, the impedance controlling rectifier 506 presents a lower impedance to the leakage inductance, which in turn may increase the current, that may be released to the variable resistive load 514.

Figure 6:
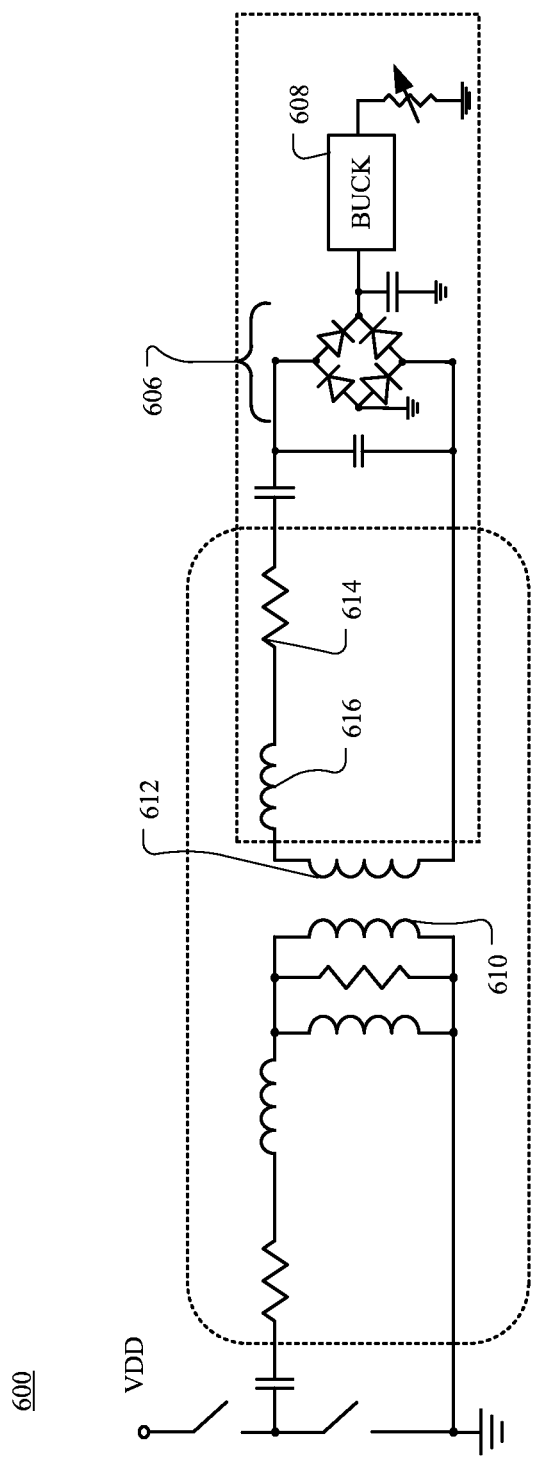
FIG. 6 is a simplified signal flow schematic of one example of an inductive power transfer system adapted to dynamically change receiver impedance.

FIG. 6 is a simplified signal flow schematic of one example of an inductive power transfer system adapted to dynamically change receiver impedance. For example, the inductive power transfer system 600 may include a transmitter and receiver portion, each including a transmitter coil 610 and a receiver coil 612 respectively. The resistor 614 and inductor 616 represent a leakage inductance within the system 600. For simplicity of description, certain unlabeled components of the inductive power transfer system 600 are illustrated. One may appreciate that these elements, illustrated as ideal electrical components, may represent electrical properties of one or more portions of inductive power transfer system 600.

The turns ratio of the transmitter coil 610 to the receiver coil 612 may vary from embodiment to embodiment, but may, in many examples, be optimized for transferring the power required by the receiver portion. In still further examples, the receiver portion may require the alternating current induced in the receiver coil 612 to be rectified to direct current. Accordingly, the receiver portion may include a rectifier 606 that may, in some embodiments, be a full wave rectifier. In many embodiments, the rectifier 606 may be a passive rectifier, such as illustrated.

Coupled to the output of the rectifier may be an impedance controller, here depicted as a buck converter 608. The output of the buck converter 608 may direct power to a variable resistive load, such as a portable electronic device.

In these embodiments, the inductive power transfer system 600 may be optimized for high impedance. The buck converter 608 may reduce the voltage and step up the current through the variable resistive load. For example, when the variable resistive load is high, a low frequency may be used to transfer power from the inductive power transmitter to the inductive power receiver. Similarly, when the variable resistive load is low, a higher frequency may be used. Efficiency of power transfer between the transmitter and receiver may be optimized for all load characteristics of the variable resistive load. It should be appreciated that a programmable boost-buck converter may be used in some embodiments, in order to control the step down/step up of the converter. In some embodiments, the programmable boost-buck converter may be dynamically controlled (for example, through a feedback loop) to compensate for changes in the load. In some embodiments, a fixed buck converter may be employed.

Figure 7:
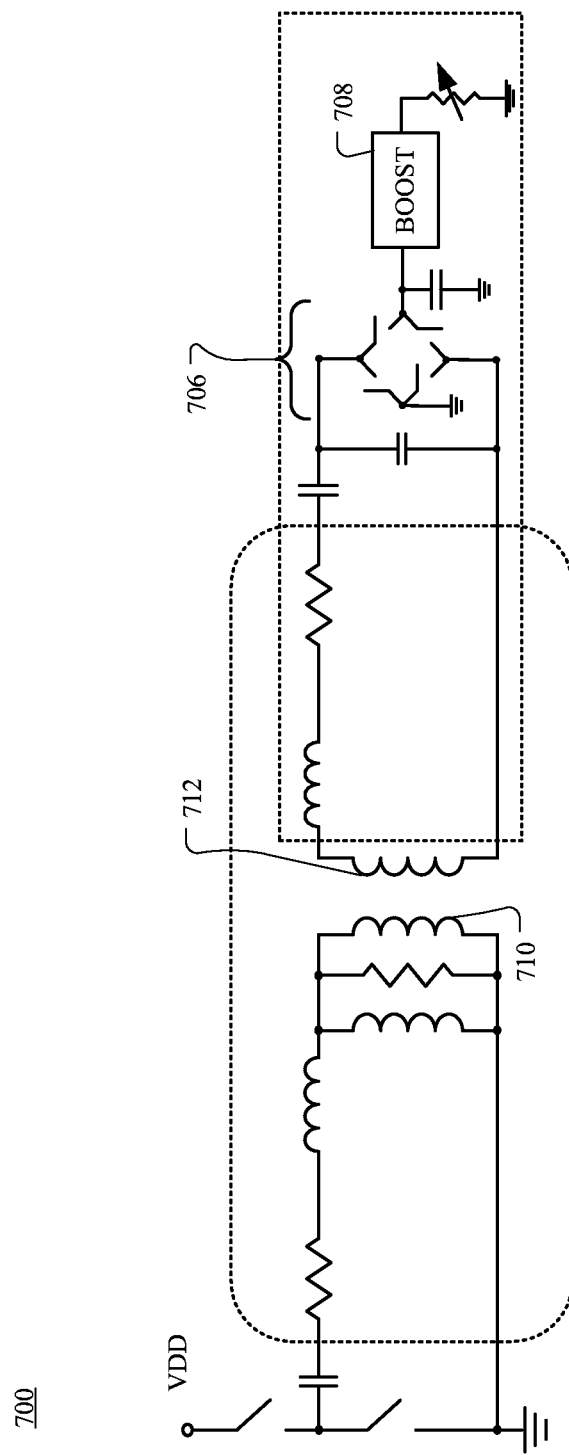
FIG. 7 is a simplified signal flow schematic of one example of an inductive power transfer system adapted to dynamically change receiver impedance.

FIG. 7 is a simplified signal flow schematic of one example of an inductive power transfer system adapted to dynamically change receiver impedance. As with FIG. 6, the inductive power transfer system 700 may include a transmitter coil 710 and a receiver coil 712, the receiver coil 712 coupled to a rectifier 706 whose output is coupled through an impedance controller 708 to a variable resistive load. However, as illustrated the rectifier 706 may be an active rectifier. For example, a controller (not shown) may be coupled to each of the four switches illustrated in rectifier 706. The controller may selectively open or close one more of the switches of the rectifier 706. In this manner, the switches of the rectifier 706 may represent a synchronous rectifier. However, in many embodiments, the control signal of the switches may be modified so as to boost the output voltage above what a conventional active rectifier may be. Accordingly, the rectifier 706 may function as a boost converter.

As with FIG. 6, for simplicity of description, certain unlabeled components of the inductive power transfer system 700 are illustrated. One may appreciate that these elements, illustrated as ideal electrical components, may represent electrical properties of one or more portions of inductive power transfer system 700.

Figure 8:
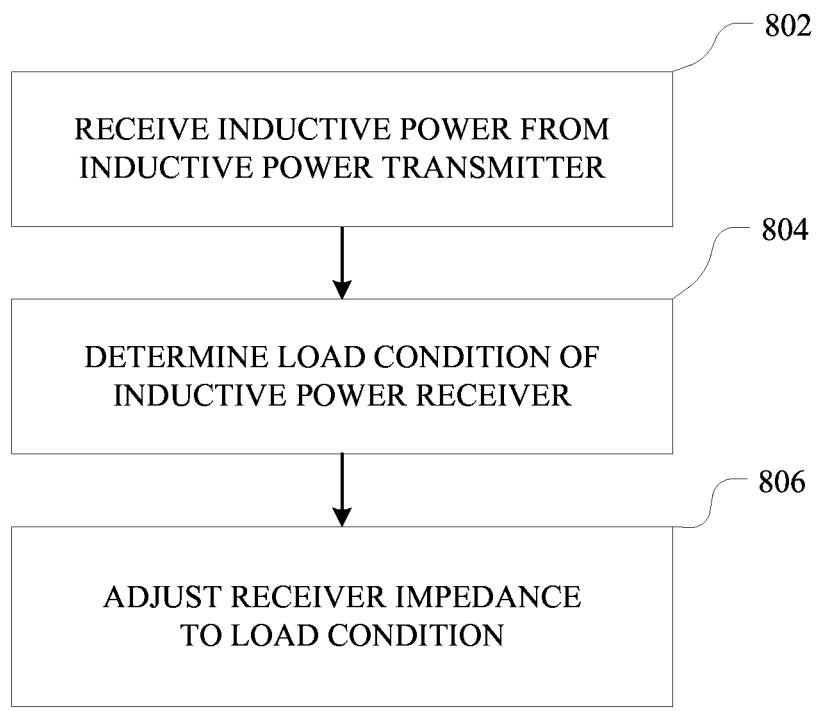
FIG. 8 is a simplified flow diagram illustrating example operations of a method of dynamically adjusting receiver impedance.

FIG. 8 is a simplified flow diagram illustrating example operations of a method of dynamically adjusting receiver impedance. The method may begin with the inductive power receiver operable to receive inductive power from an inductive power transmitter. At operation 802, inductive power may be received by the inductive power receiver. Thereafter, at 804 the inductive power receiver may determine that a load condition has changed. For example, the inductive power receiver may require less power. At operation 806, the effective impedance of the inductive power receiver may be changed as a function of, or in response to, the load condition determined at 804.

In the present disclosure, the methods disclosed may be implemented as sets of instructions or software readable by a device. Further, it is understood that the specific order or hierarchy of operations in the methods disclosed are examples of sample approaches. In some embodiments, the specific order or hierarchy of steps in the method can be rearranged while remaining within the disclosed subject matter. The accompanying method claims present elements of the various steps in a sample order, and are not necessarily meant to be limited to the specific order or hierarchy presented.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

We claim:

1. An electromagnetic induction power transfer apparatus comprising:
   an inductive power transmitter, comprising:
      a power supply with an active state and an inactive state, configured to switch between the active state and the inactive state at a selectable duty cycle; and
      a power-transmitting inductor coupled to the power supply; and
   an inductive power receiver, comprising:
      a power-receiving inductor, positioned inductively proximate the power-transmitting inductor;
      a programmable load; and
      an impedance controller coupled to the power receiving inductor and configured to increase or decrease an electrical impedance of the inductive power receiver in response to a change in a power requirement of the programmable load, the impedance controller comprising a synchronous bridge rectifier comprising:
         an oscillator having a controllable duty cycle; and
         a plurality of switches, each switchable at least in part in response a voltage polarity of the power-receiving inductor and a voltage magnitude of the oscillator.

2. An electromagnetic induction power receiving apparatus comprising:
   a power-receiving inductor;
   a programmable load; and
   an impedance controller coupled to the power-receiving inductor and configured to increase or decrease an electrical impedance of the power-receiving inductor in response to a change in a power requirement of the programmable load, the impedance controller comprising a synchronous bridge rectifier comprising:
      an oscillator having a controllable duty cycle; and
      a plurality of switches, each switchable at least in part in response a voltage polarity of the power-receiving inductor and a voltage magnitude of the oscillator.

3. A method of operating an inductive power receiver associated with a portable electronic device, the method comprising:
   determining a load condition of the portable electronic device;
   receiving inductive power from an inductive power transmitter; and
   adjusting the input impedance of the inductive power receiver with respect to the inductive power transmitter in response to the determined load condition by modifying an operation of a synchronous bridge rectifier configured to rectify the received inductive power, the synchronous bridge rectifier comprising:
      an oscillator having a controllable duty cycle; and
      a plurality of switches, each switchable at least in part in response a voltage polarity of the received power and a voltage magnitude of the oscillator.

4. The method of claim 3, wherein the operation of adjusting the impedance of the inductive power receiver is performed at least in part by an impedance controller.

5. The method of claim 4, further comprising:
   determining that the load condition of the portable electronic device has changed.

6. The method of claim 5, further comprising:
   determining that the load condition of the portable electronic device has increased.

7. The method of claim 6, further comprising:
   upon determining that the load condition of the portable electronic device has increased, decreasing an effective impedance of the inductive power receiver.

8. The method of claim 6, further comprising:
   determining that the load condition of the portable electronic device has decreased.

9. The method of claim 8, further comprising:
   upon determining that the load condition of the portable electronic device has decreased, increasing an effective impedance of the inductive power receiver.

* * * * *